United States Patent [19]

Heuber et al.

[11] 4,313,177
[45] Jan. 26, 1982

[54] STORAGE CELL SIMULATION FOR GENERATING A REFERENCE VOLTAGE FOR SEMICONDUCTOR STORES IN MTL TECHNOLOGY

[75] Inventors: Klaus Heuber, Boeblingen; Erich Klink, Schoenaich; Volker Rudolph, Aidlingen; Siegfried K. Wiedmann, Stuttgart, all of Fed. Rep. of Germany

[73] Assignee: International Business Machines Corporation, Armonk, N.Y.

[21] Appl. No.: 147,997

[22] Filed: May 12, 1980

[30] Foreign Application Priority Data

Oct. 29, 1979 [DE] Fed. Rep. of Germany ....... 2943565

[51] Int. Cl.³ ............................................ G11C 11/40
[52] U.S. Cl. ................................... 365/174; 365/203; 365/210
[58] Field of Search ....................... 365/174, 203, 210

[56] References Cited

U.S. PATENT DOCUMENTS

| | | | |
|---|---|---|---|
| 3,643,231 | 2/1972 | Lohrey et al. | 365/189 |
| 3,736,477 | 5/1973 | Berger et al. | 317/235 |
| 3,815,106 | 6/1974 | Wiedmann | 365/154 |
| 3,816,758 | 6/1974 | Berger et al. | 307/214 |
| 3,886,531 | 5/1975 | McNeill | 365/174 |
| 3,993,918 | 11/1976 | Sinclair | 307/279 |
| 4,021,786 | 5/1977 | Peterson | 365/189 |
| 4,057,789 | 11/1977 | Spadavecchia et al. | 365/189 |
| 4,075,609 | 2/1978 | Millhollan | 365/154 |
| 4,090,255 | 5/1978 | Berger et al. | 365/154 |
| 4,122,548 | 10/1978 | Heuber et al. | 365/203 |
| 4,200,918 | 4/1980 | Glock et al. | 365/210 |

OTHER PUBLICATIONS

"Current Hogging Injection Logic" by R. Muller, IEEE Journal of Solid-State Circuits, vol. SC-10, No. 5, Oct. 1975, pp. 348-352.

"Injection-Coupled Memory" by S. K. Weidmann, IEEE Journal of Solid-State Circuits, vol. SC-8, No. 5, Oct. 1973, pp. 332-337.

"Merged-Transistor Logic (MTL)" by Berger et al., IEEE Journal of Solid-State Circuits, vol. SC-7, No. 5, Oct. 1972, pp. 340-346.

Primary Examiner—Terrell W. Fears
Attorney, Agent, or Firm—Wesley DeBruin

[57] ABSTRACT

Disclosed is a simulated storage cell structure for use as a reference voltage generator in a semiconductor store fabricated in Merged Transistor Logic (MTL) technology. The simulated storage cell structure includes n elongated regions of P-type diffusion arranged in parallel to each other in an N-type trough of semiconductor material. The elongated P-type regions are alternately designed as collector and Injector strips.

6 Claims, 7 Drawing Figures

STORAGE CELL SIMULATION FOR GENERATING A REFERENCE VOLTAGE FOR SEMICONDUDTOR STORES IN MTL TECHNOLOGY

The invention relates to a simulated storage cell structure for use as a reference voltage generator in a semiconductor store fabricated in Merged Transistor Logic (MTL) Technology.

CROSS-REFERENCE TO RELATED APPLICATIONS AND PATENTS

U.S. Patent Application Ser. No. 101,366 entitled "Method and Circuit Arrangement for Controlling An Integrated Semiconductor Memory" filed Dec. 7, 1979 by K. Hueber et al., granted as U.S. Pat. No. 4,280,198 on July 21, 1981, and of common assignee herewith.

U.S. Patent Application Ser. No. 136,859 entitled "Method of And Circuit Arrangement for Reading and/or Writing An Integrated Semiconductor Storage With Storage Cells in MTL Technology", filed Apr. 3, 1980 by H. H. Heimeier et al., and of common assignee herewith.

U.S. Patent Application Ser. No. 167,560 entitled "Restore Circuit For A Semiconductor Storage", filed July 11, 1980 by K. Heuber et al., and of common assignee.

U.S. Pat. No. 4,090,255 entitled "Circuit Arrangement For Operating A Semiconductor Memory System" granted May 16, 1978 to H. H. Berger et al., and of common assignee herewith.

U.S. Pat. No. 4,122,548 entitled "Memory Storage Array With Restore Circuit" granted Oct. 24, 1978 to K. Heuber et al., and of common assignee herewith.

BACKGROUND OF THE INVENTION AND PRIOR ART

U.S. Pat. No. 3,643,231 entitled "Monolithic Associative Memory Cell" granted Feb. 15, 1972 to F. H. Lohrey and S. K. Wiedmann, and of common assignee herewith. The Lohrey et al patent discloses an associative memory storage cell having two cross-connected transistors with the word line for the cell connected to the common emitters of the two transistors and having each of the bases of the two transistors connected to the base of an input/output transistor. The emitter of each of these input/output transistors is connected to a separate bit line and the collectors of the input/output transistors are connected together and to the associative sense amplifier. To associatively search the memory, one of the bit lines is lowered. This causes the input/output transistor connected to the lowered bit line to conduct and thereby give a no-match signal to the associative sense amplifier if its base is connected to the base of the conducting one of the two cross-connected transistors and it causes that transistor to remain nonconductive and thereby give a match signal to the associative sense amplifier if it is connected to the base of the non-conducting one of the two cross-connected transistors.

U.S. Pat. No. 3,736,477 entitled "Monolithic Semiconductor Circuit Concept of High Packing Density" granted May 29, 1973 to H. H. Berger and S. K. Wiedmann and of common assignee herewith. The Berger et al patent discloses a monolithic semiconductor circuit comprising a lateral PNP transistor and an inversely operated vertical NPN transistor. The lateral transistor is formed by a pair of mutually spaced P-type regions diffused in an N-type semiconductor body. The collector region has diffused therein a region of N-type and constituting the collector of the vertical transistor. The semiconductor body constitutes the base region of the lateral transistor and the emitter region of the vertical transistor.

U.S. Pat. No. 3,815,106 entitled "Flip-Flop Memory Cell Arrangement" granted June 4, 1974 to S. K. Wiedmann, and of common assignee herewith. The Wiedmann patent discloses a memory cell arrangement which allows the powering of only two row cells at any one time. This results in lower power dissipation in the cells and also permits the driving circuits to operate at a much lower power level, thereby further reducing the power dissipation per chip.

U.S. Pat. No. 3,816,758 entitled "Digital Logic Circuit" granted June 11, 1974 to H. H. Berger and S. K. Wiedmann, and of common assignee herewith. The Berger et al patent discloses a digital logic circuit comprising a first transistor of a predetermined conductivity type and having an emitter, a base and a collector, a second transistor of the opposite conductivity type and having an emitter, a base and a collector, an input adapted to receive a digital logic signal, an output, a current source, means connecting said first transistor emitter to said current source, means connecting said first transistor base to said second transistor emitter, means connecting said first transistor collector and said second transistor base to said input, and means connecting said second transistor collector to said output.

U.S. Pat. No. 3,886,531 entitled "Schottky Loaded Emitter Coupled Memory Cell For Random Access Memory" granted May 27, 1975 to J. L. McNeill. The McNeill patent discloses a memory cell for a random access memory, the cell including a bistable circuit having first and second cross-coupled transistors with plural emitters. One emitter of each of the first and second transistors is coupled in common. The collector loads for the first and second transistors are provided by respective Schottky diodes which enable the differential voltage in the memory cell to remain low and the cell to be unsaturated over an order of magnitude of current increase to provide for a higher ratio of cell read current to cell store current. Additionally, hard saturation of the memory cell which would otherwise increase the write time is eliminated by this construction.

U.S. Pat. No. 3,993,918 entitled "Integrated Circuits" granted Nov. 23, 1976 to A. W. Sinclair. The Sinclair patent discloses a master/slave bistable arrangement which operates on current levels rather than voltage levels and with a single input of clock pulses. There are different bias current levels which are advantageously supplied by multi-layer current injection structures in integrated form.

U.S. Pat. No. 4,021,786 entitled "Memory Cell Circuit and Semiconductor Structure Therefore" granted May 3, 1977 to H. W. Peterson. The Peterson patent discloses a memory cell which comprises a word line, a pair of bit lines, a pair of current sources each having a first side coupled to a corresponding one of the bit lines; and a bistable circuit means operatively coupled to the word line and to another side of each of the current sources, whereby the bistable circuit means assumes one stable state upon the application of a voltage on one bit line, and assumes another stable state upon the application of a voltage on the other bit line.

U.S. Pat. No. 4,057,789 entitled "Reference Voltage Source For Memory Cells" granted Nov. 8, 1977 to R. I. Spadavecchia and of common assignee with the subject application.

U.S. Pat. No. 4,090,255 entitled "Circuit Arrangement For Operating A Semiconductor Memory System" granted May 16, 1978 to H. H. Berger et al., and of common assignee herewith. The Berger et al patent discloses a circuit arrangement for operating the read/write cycles of an integrated semiconductor memory storage system whose storage cells consist of flip flops with bipolar switching transistors, Schottky diodes as read/write elements coupling the cell to the bit lines, and high-resistivity resistors, or transistors controlled as current sources, as load elements, in several phases. This is accomplished through coupling the storage cell to both read/write circuits and restore/recovery circuits via the bit lines and by selective pulsing of the cell with the read/write circuits and the restore/recovery circuits. This permits high speed, low operating current, large scale memory systems to be built.

IBM Technical Disclosure Bulletin publication entitled "MTL Storage Cell" by S. K. Wiedmann, Vol. 21, No. 1, June 1978, pages 231-2.

"Merged-Transistor Logic (MTL)-A Low-Cost Bipolar Logic Concept" by Horst H. Berger and Siegfried K. Wiedmann, IEEE Journal of Solid-State Circuits, Vol. SC-7, No. 5, October 1972, pages 340-6.

"Integrated Injection Logic: A New Approach to LSI" by Kees Hart and Arie Slob, IEEE Journal of Solid-State Circuits, Vol. SC-7, No. 5, October 1972, pages 346-51.

"Integrated Injection Logic ($I^2L$)" by C. M. Hart and A. Slob, Philips Technical Review, Volume 33, 1973, No. 3, pages 76 to 85.

IBM Technical Disclosure Bulletin Publication entitled "$I^2L$/MTL Storage Cell Layout" by H. H. Berger et al., Vol. 22, No. 10, March 1980, pages 4604-5.

From German patent No. 2 657 561 (U.S. Pat. No. 4,122,548) a restore circuit for a semiconductor store with storage cells of bipolar transistors has become known which is characterized in that a standby reference circuit is controlled via a restore control line by a clock signal, that to the standby reference circuit an error reference circuit is connected, and that both are connected to the restore circuits via a reference line, that the levels of the voltages on the bit lines in the standby state are determined by the current flowing through two current sources which are directly connected to the bit lines and to the decoupling diodes designed as Schottky diodes, and connected to the reference line by a common cathode terminal.

This presents already a restore reference circuit for the standby state, and one for an error. One disadvantage of this circuit is that it cannot be used for integrated stores with MTL storage cells since such storages can present an additional problem, as discussed below.

For reading out the information stored in an MTL cell the latter's word line potential is decreased by several 100 mV, and at the same time a read current is applied through each one of the two existing bit lines. As the emitter-base voltages of the existing PNP transistors of all unselected storage cells are lower by approximately 0.5 V than the emitter-base voltage of the selected storage cell, practically the entire read current flows into the selected storage cell. The main effect thereof is that the emitter base voltage of one cell-PNP-transistor is higher than that of the other one. The voltage difference is indicated in the read/write amplifier. If now n unselected cells have stored a 0, there flows in spite of the practically switched-off injection current a re-injection current IR of approximately $1/2 \cdot IO \cdot n$, IO being the standby injection current of the storage cell. Owing to the high storage capacity, this re-injection current fades only slowly. So as to avoid a great influence of this parasitic read current on the reading process, the read current of the selected cell is to be high compared with the parasitic re-injection current of the unselected cell. For that reason, the standby current of the storage cell has to be kept at a very low level which e.g., in present day technique varies between 10 and 100 nA approximately. This permits a very low storage standby power, but it also comprises considerable difficulties for the restore operation, for to ensure on the one hand that the unselected cells receive enough current in a continuous selection of the storage chip for maintaining the stored information, and to make sure on the other hand that the standby current does not disturb the read process an extremely precise bit line restore operation would have to be performed. A usually performed over-control is not possible here. It has therefore been suggested in German patent application P 29 29 384.3 (U.S. Patent Application Ser. No. 167,560, filed July 11, 1980.) to provide a restore circuit via an integrated semiconductor store whose storage cells consist of bipolar transistors with PNP load elements which are arranged at the intersections of word lines and bit line pairs, that restore circuit supplying the necessary voltages for maintaining the stored information via bit and-/or word reference lines as well as bit restore and/or word restore switches, which is characterized in that connected to the bit reference line and the word reference line an impedance converter is provided serving as a voltage source with a very low internal resistance, the output voltage of that impedance converter being adjusted by a group of reference storage cells preceding it.

SUMMARY OF THE INVENTION

As the reference storage cells are integrated on one chip with the actual data storage cells and can amount to up to 20% of the actual data storage cells, the loss of space on a storage chip caused by such reference storage cells is relatively high.

It is therefore the object of the invention to reduce considerably the chip space required for the reference storage cells by a storage cell simulation which satisfies all critical voltage and current criteria but does not have to be designed for data storing.

The solutions in accordance with the invention is specified in the following numbered paragraphs:

No. 1 A storage cell simulation structure for use as the reference voltage generator in a semiconductor store fabricated in MTL technology on a common semiconductor chip, characterized in that n areas (11-15) of P-diffusions are arranged in parallel to each other within an N-trough (18) and designed alternately as collector or injector strips.

No. 2 A storage cell simulation structure as recited in numbered paragraph 1 supra, characterized in that a P-diffusion strip is metallically connected as a collector strip (13) to a fixed potential to prevent the re-injection from the collector strip (13), that two P-strips (12 and 14) adjacent to this collector strip (13) serve as injector strips and are connected to a source supplying the current in accordance with the standby current of the cells and to the reference amplifier (2), and that the two outer P-diffusion strips (11 and 15) serve as floating collectors, whereas the N-trough (18) is connected to the word reference line (4) of the data cell array (5).

No. 3 A storage cell simulation structure as recited in numbered paragraph 1 or 2 supra, characterized in that the injector strips (12 and 14) connected to the current source inject at their two edges a hole current so that the injected current is collected by collector strip (13), and directed via a contact (17) to the N-trough (18) and from there to word reference line (4), whereas the PNP structure of the two adjacent strips simulate a saturated input/output PNP transistor.

No. 4 A storage cell simulation structure as recited in numbered paragraph 3 supra, characterized in that the current injected at the left edge of the left injector strip (12) flows to the adjacent P-strip (11) which is floating, where it is collected and where part of the current is re-injected again and collected by the injector strip (12).

No. 5 A circuit arrangement as recited in numbered paragraph 4, supra characterized in that the PNP structure of the floating collector strip (11) and of the left injector strip (12) simulate the saturated input/output PNP transistor.

No. 6 A circuit arrangement as recited in numbered paragraphs 1, 2, 3, 4 or 5, supra, characterized in that the injector strips and the floating collector strips are arranged symmetrically to the collector strips connected to the N-trough (18).

No. 7 A storage cell simulation structure as recited in numbered paragraphs 1, 2, 3 or 4 supra, characterized in that the width of the floating collector strip (11) is equal to, or smaller than the width of the collector strip of the MTL storage cell (according to FIG. 2).

No. 8 A storage cell simulation structure as recited in numbered paragraphs 1, 2, 3, 4, 5 or 6 supra, characterized in that the N-trough (18) is limited by an oxide ring or by an N+-ring.

No. 9 A storage cell simulation structure for generating reference voltage for a semiconductor store, characterized in that an injector strip shows on one or two longitudinal sides two or more collectors, of which at least one is floating and at least another one is applied to a fixed potential.

No. 10 A storage cell simulation structure as recited in numbered paragraph 9, supra, characterized in that the floating collectors and the collectors applied to a fixed potential are arranged alternately one over the other on at least one longitudinal side of the injector area.

The above discussed disadvantages of the formerly used reference voltage cells are avoided in that an equivalent reference voltage cell is provided requiring only approximately 1/5 of the surface of a conventional storage cell. This considerable reduction of circuit area required is based on the idea that actually the reference cells are not included in data storage so that an equivalent circuit is to be designed which satisfies all critical voltage and current conditions but which does not have to be equipped for the storing of a bit. It is thus possible that the diffusions are combined in such a manner that the correct cell reference voltage is given but that no actual data storage cell is formed. Another advantage consists in that between the actual data storage cells and the simulated reference storage cells a temperature and process parameter tracking is achieved. The simulation of the reference storage cells needs approximately 1/5 of the surface compared with the surface required for the hitherto used reference storage cell. Owing to its smallness, it is less open to defects, and furthermore the reference voltage cells can now be provided in the periphery of the free chip silicon surface which permits another saving of effective chip surface.

DESCRIPTION OF THE DRAWINGS

These and other features of the present invention will be more fully appreciated and understood by considering the following description taken in conjunction with the accompanying drawings.

Below, the invention will be described with reference to an embodiment shown in the drawing.

(FIG. 2A is a sectional view taken along the line 2A—2A of FIG. 2).

DESCRIPTION OF THE INVENTION

Figure 1:
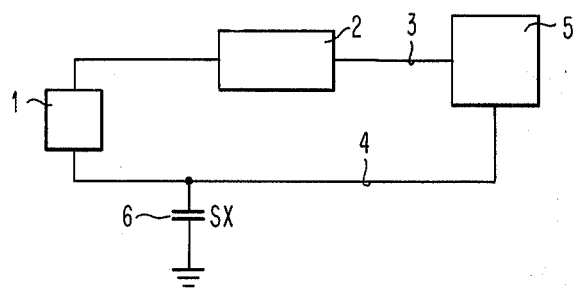
FIG. 1 is a basic circuit block diagram of a store with reference storage cells.

The basic circuit diagram shown in FIG. 1 of the MTL store with reference voltage cells shown on the left side, the actual reference voltage generator, which in the described known arrangement consists of approximately 500 complete reference storage cells for a 16 K storage chip. This reference voltage generator 1 is connected to the actual storage cell array 5 on the one hand via a reference amplifier 2 and a bit reference line 3, and on the other via a word reference line 4. FIG. 1 also schematically represents the capacitance 6 from the subcollector to the substrate which in the equivalent diagram according to FIG. 1 is connected to ground, and to word reference line 4.

Figure 2:
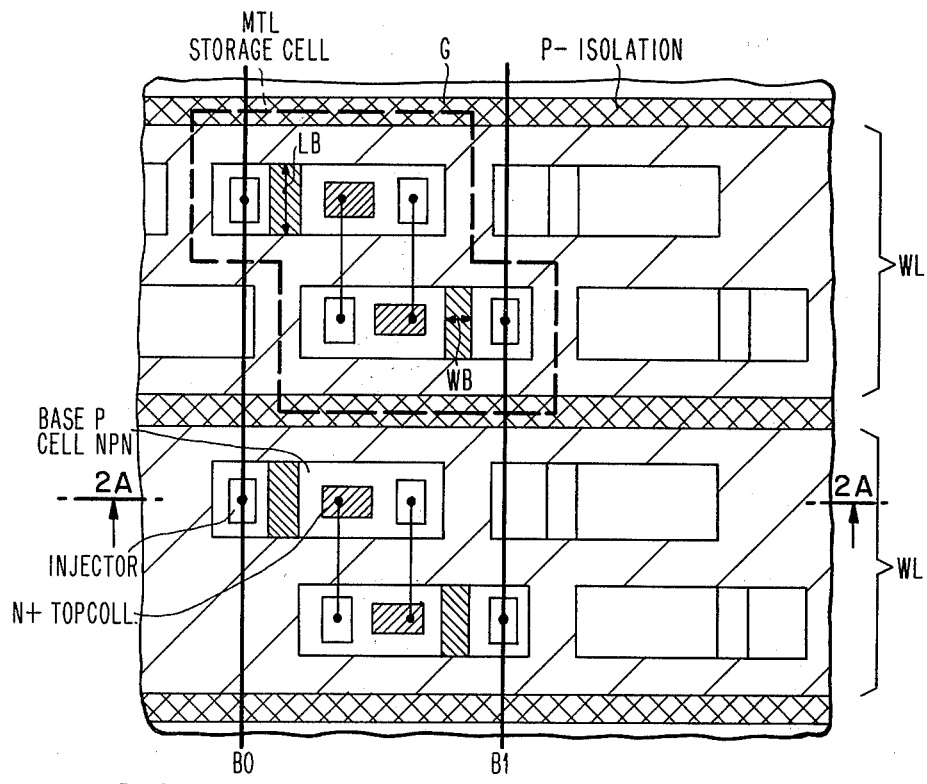
FIG. 2 is the plan view of a complete MTL storage cell.

The actual data storage cell array 5 comprises in this embodiment MTL storage cells as shown in FIG. 2 and described below. FIG. 2 shows two such MTL storage cells separated from each other by means of isolation regions. [Reference is made to the IBM Technical Disclosure Bulletin Publication entitled "MTL Memory Cell" by S. K. Wiedmann, Vol. 21, No. 1, June 1978].

Figure 2A:
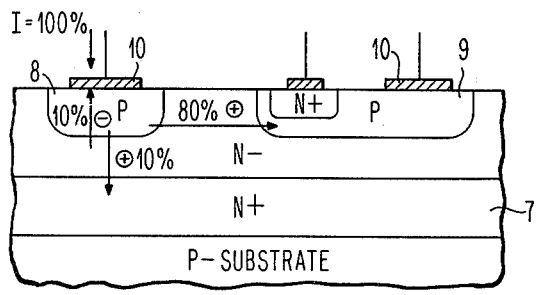
FIG. 2A is a conductive input/output PNP transistor.

In the stable state, one cell transistor within a cell is non-conductive, and the other is conductive. For the lateral input/output PNP transistor this means that one is operated in the active zone and the other in the saturation zone. An input/output PNP transistor has for the direction from the injector to the base of the cell transistor TX an $\alpha F$ of approximately 0.8, and in the inverse direction from the base of the cell transistor to the injector an $\alpha R$ of approximately 0.7, owing to the larger surface of the P-diffusion of the cell transistor base relative to the injector surface. FIG. 2A shows a conductive input/output PNP transistor, or a half-cell. Injector 8 and collector 9 of the PNP output transistor are arranged over subcollector 7. The left contact 10 on the injector is arranged on base 9 of the NPN cell transistor. The right contact 10 is connected to the collector of the NPN transistor of the adjacent half-cell. There, approximately 80% of the standby current applied to the injector flows in lateral direction over the base zone of the PNP transistor, and only approximately 10% respectively of the current will re-combine at the contact and in the subcollector. The arrows with the carrier symbol represent the direction of the carrier movement.

Similar facts apply to the saturated input/output PNP transistor, with the difference that the current injected by the cell base zone and collected by the injector is to be considered applied current.

The above discussed current ratios show that the conditions in the lateral base are to be simulated with precision, whereas the surface ratio of injector and cell transistor base contributes as an effect of the second order only. Furthermore, approximately half of the cell height is available as length of injector edges.

The reference cells of reference voltage generator 1 in FIG. 1 are not real storage cells or reference cells, respectively but equivalent circuits. Such an equivalent circuit is shown in FIGS. 3 and 3A representing a sectional view through the layout along line 3A—3A.

Figures 3, 3A:
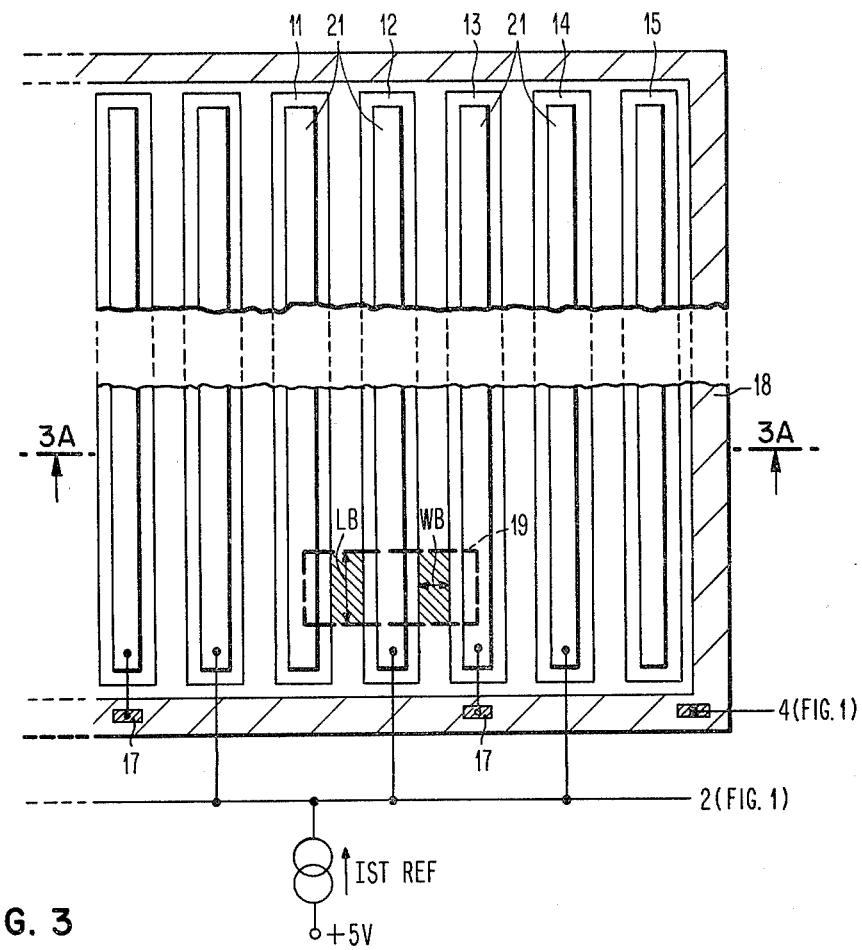
FIG. 3 is the plan view of a design of equivalent reference voltage storage cells in the form of P-diffusion strips.
FIG. 3A is a sectional view along line 3A—3A in FIG. 3.

FIG. 3 shows that within an N-trough 18 e.g., seven individual P-strips are arranged over a subcollector zone. N-trough 18 can also be limited by an oxide or N+-ring.

Strip 12 simulates the injectors of an MTL storage cell that are arranged in parallel. By placing the injectors one directly beside the other, no surface is required for the insulation ring. If current is applied to the injector strip 12 it injects a hole current at its edges. As any other strip 11, 13 to 15, injector strip 12 consists of a base diffusion on which a P-contact strip 21 has been provided.

In the following, the right edge of injector strip 12 will be discussed. Here, the injected current is collected by collector strip 13 and directed via a contact 17 to insulation ring 18 and from there to word reference line 4. The PNP structure of the two strips 12 and 13 simulates the conductive input/output PNP transistor. In the left edge of injector strip 12 the current injected there flows to the floating P-strip 11, is collected there, and partly re-injected and collected by injector strip 12. The PNP structure of strips 12 and 11 simulates the saturated input/output PNP transistor of a storage cell.

Figure 4:
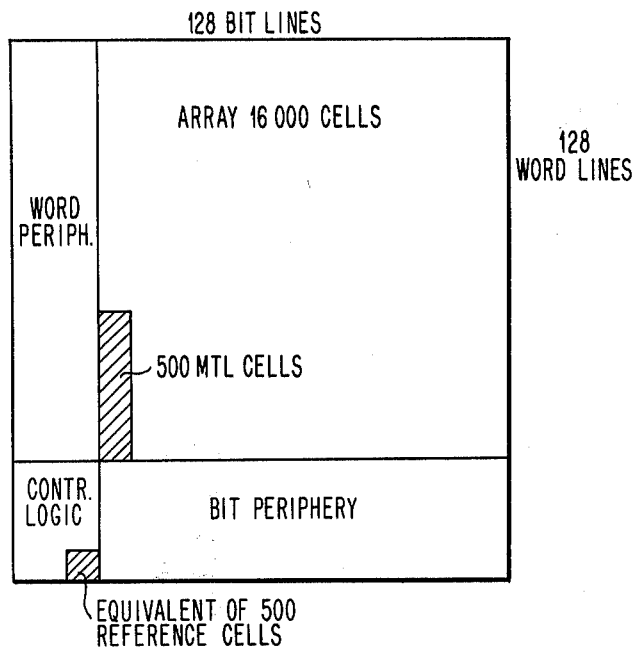
FIG. 4 is a representation of the dimensions and the arrangement of equivalent reference cells, and of the actual storage cells on a semiconductor chip.

Symmetrically to strip 13, strips 11 and 12 are repeated as strips 14 and 15, the surface of strip 13 being saved once in this manner. Framed surface 19 in FIG. 3 represents the equivalent to a complete MTL storage cell. Two such cells are shown in FIG. 2. Because the P-strips (i.e., the right and the left edge) are utilized twice, and because the insulation ring with its out-diffusion has been saved, the height of the simulated structure is only approximately ¼ of that of an MTL storage cell. Because of the two adjacent bit lines, the cell spacing on the original layout has to be slightly larger than on the schematic layout according to FIG. 2, so that the equivalent reference cell covers approximately 1/5 of the surface of an MTL storage cell. The proportions of the reference storage cells and data storage cells, and of the peripheral circuits on a chip are given schematically in FIG. 4. This drawing also shows quite clearly that the 500 equivalent reference cells in the left hand lower part of the chip merely cover already existing chip surface which is not used otherwise. In comparison thereto, 500 MTL storage cells are marked on the actual storage surface. In the given example for 16 K storage cells, at least another 500 storage cells can be applied on the same silicon surface, without any change of technology and layout of the actual storage cells. If owing to the design of the storage chip a higher number of reference storage cells is required the amount of effective silicon surface saved is even higher.

Figure 5:
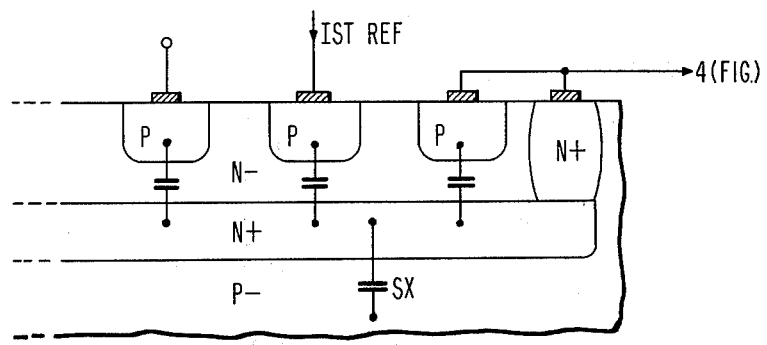
FIG. 5 is a basic circuit diagram representing the barrier layer capacities between the P-strip and the subcollector for a predetermined number of equivalent reference storage cells.

In FIG. 5, a cross-section through the layout is combined with an equivalent circuit diagram to display the individual capacities and their effect. According to FIG. 5, the barrier layer capacity between the injectors and the subcollector is of advantage for 500 equivalent reference storage cells as it contributes to the stabilization of the reference voltage. The capacity from the subcollector to the substrate is arranged in parallel via the word reference line to all word line capacities. This capacity is not re-loaded and thus does not require any electric energy. By means of this simulation of a reference storage cell, a cell reference voltage of high precision is achieved, the simulation requiring only approximately 1/5 of the surface of an original storage cell. Furthermore, the simulations of the reference storage cells also supply the correct cell reference voltage as the global process parameters for a chip are uniform, and as on a chip a uniform temperature can be assumed.

While the invention has been particularly shown and described with reference to the preferred embodiment thereof, it will be understood by those skilled in the art that numerous changes in form and detail of the circuit may be made therein without departing from the spirit and scope of the invention.

We claim:

1. A solid state reference voltage generator circuit structure for a solid state memory fabricated in a P-type substrate of semiconductor material, said solid-state reference voltage generator circuit structure comprising:
   an N-type epitaxial layer formed on a surface of said P-type substrate;
   an N-type subcollector region formed in said P-type substrate beneath said epitaxial layer;
   a plurality of elongated P-type regions formed in said epitaxial layer, said plurality of elongated P-type regions being co-extensive one to the other and equally spaced one from another; and
   means for electrically isolating said plurality of elongated P-type regions formed in said epitaxial layer.

2. A simulated storage cell structure for use as a reference voltage generator in a semiconductor store fabricated in Merged Transistor Logic (MTL) technology, said simulated storage cell structure comprising:
   a P-type semiconductor substrate;
   an N-type semiconductor epitaxial layer formed on a surface of said P-type substrate;
   an N+ type subcollector semiconductor region formed in said P-type substrate beneath said epitaxial layer;
   a plurality of elongated P-type semiconductor regions formed in a portion of said epitaxial layer;
   an additional N+ type semiconductor region integral with said N+ type subcollector region, said additional N+ type semiconductor region and said N+ type semiconductor subcollector region together fully encompassing said portion of said epitaxial layer containing said plurality of elongated P-type semiconductor regions;

current source means connected to predetermined ones of said plurality of elongated P-type semiconductor regions formed in said portion of said epitaxial layer; and output circuit means connected in common to other predetermined ones of said plurality of elongated P-type semiconductor regions, said additional N+ type semiconductor region and said N+ type semiconductor subcollector region.

3. A simulated storage cell structure for use as a reference voltage generator in a semiconductor store fabricated in Merged Transistor Logic (MTL) technology, as recited in claim 1, where said plurality of elongated P-type regions consists of an odd integer number of elongated P-type regions and wherein said predetermined ones connected to said current source means constitutes alternate ones of said odd integer number of elongated P-type regions.

4. A simulated storage cell structure for use as a reference voltage generator in a semiconductor store fabricated in Merged Transistor Logic (MTL) technology, as recited in claim 13, wherein at least one of said plurality of elongated P-type semiconductor regions is "floating" (not connected to said current source means nor to said output circuit means).

5. A simulated storage cell structure for use as a reference voltage generator in a semiconductor store fabricated in Merged Transistor Logic (MTL) technology, said simulated storage cell structure comprising:

a P-type semiconductor substrate;

an N-type semiconductor epitaxial layer formed on a surface of said P-type substrate;

an N+ type subcollector semiconductor region formed in said P-type substrate beneath said epitaxial layer;

a plurality of elongated P-type semiconductor regions formed in a portion of said epitaxial layer;

an isolation region integral with said N+ type subcollector region, said isolation region and said N+ type semiconductor subcollector region together fully encompassing said portion of said epitaxial layer containing said plurality of elongated P-type semiconductor regions;

potential source means connected to predetermined ones of said plurality of elongated P-type semiconductor regions formed in said portion of said epitaxial layer; and output circuit means connected in common to other predetermined ones of said plurality of elongated P-type semiconductor regions, and said N+ type semiconductor subcollector region.

6. A simulated storage cell structure for use as a reference voltage generator in a semiconductor store fabricated in Merged Transistor Logic (MTL) technology, as recited in claim 5, where said plurality of elongated P-type regions consists of an odd integer number of elongated P-type regions and wherein said predetermined ones connected to said potential source means constitutes alternate ones of said odd integer number of elongated P-type regions.

* * * * *

UNITED STATES PATENT AND TRADEMARK OFFICE
CERTIFICATE OF CORRECTION

PATENT NO. : 4,313,177
DATED : January 26, 1982
INVENTOR(S) : K. Heuber et al

It is certified that error appears in the above—identified patent and that said Letters Patent are hereby corrected as shown below:

Claim 3, Line 4　　　　　　Change "claim 1" to --claim 2--
(column 9, line 13)

Claim 4, Line 4　　　　　　Change "claim 13" to --claim 3--
(column 9, line 22)

Signed and Sealed this

Ninth Day of November 1982

[SEAL]

Attest:

GERALD J. MOSSINGHOFF

Attesting Officer　　　Commissioner of Patents and Trademarks